United States Patent
Kim et al.

(10) Patent No.: US 10,204,001 B2
(45) Date of Patent: *Feb. 12, 2019

(54) DATA I/O CIRCUITS AND SEMICONDUCTOR SYSTEMS INCLUDING THE SAME

(71) Applicant: SK hynix Inc., Icheon-si, Gyeonggi-do (KR)

(72) Inventors: Chang Hyun Kim, Seoul (KR); Min Chang Kim, Seoul (KR); Do Yun Lee, Yongin-si Gyeonggi-do (KR); Jae Jin Lee, Gwangju-si Gyeonggi-do (KR); Hun Sam Jung, Icheon-si Gyeonggi-do (KR)

(73) Assignee: SK hynix Inc., Icheon-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/785,836

(22) Filed: Oct. 17, 2017

(65) Prior Publication Data

US 2018/0039532 A1 Feb. 8, 2018

Related U.S. Application Data

(63) Continuation of application No. 14/947,126, filed on Nov. 20, 2015, now Pat. No. 9,823,956.

(30) Foreign Application Priority Data

Jul. 27, 2015 (KR) .................. 10-2015-0106090

(51) Int. Cl.
*H03M 13/00* (2006.01)
*G06F 11/07* (2006.01)
(Continued)

(52) U.S. Cl.
CPC ...... *G06F 11/0784* (2013.01); *G06F 11/0745* (2013.01); *G06F 11/1048* (2013.01);
(Continued)

(58) Field of Classification Search
CPC .. G06F 11/0784; G06F 11/0745; G06F 13/28; G06F 11/1012; G06F 11/1056;
(Continued)

(56) References Cited

U.S. PATENT DOCUMENTS 9,823,956 B2 * 11/2017 Kim .................. G06F 11/0784
2013/0246889 A1 9/2013 Kumar et al.

FOREIGN PATENT DOCUMENTS

KR 1020140126220 A 10/2014

* cited by examiner

*Primary Examiner* — Guerrier Merant
(74) *Attorney, Agent, or Firm* — William Park & Associates Ltd.

(57) ABSTRACT

A semiconductor system may include a first semiconductor device and a second semiconductor device. The first semiconductor device may output an external strobe signal and external data. The second semiconductor device may extract error information from the external data in synchronization with the external strobe signal during a write operation and outputs the external data and the error information through input/output (I/O) lines during the write operation. The second semiconductor device may correct errors of internal data with the error information loaded on the I/O lines to output the corrected internal data as the external data during a read operation.

24 Claims, 14 Drawing Sheets

(51) Int. Cl.
*G11C 7/10* (2006.01)
*G11C 7/22* (2006.01)
*G06F 13/28* (2006.01)
*G11C 5/04* (2006.01)
*G11C 29/52* (2006.01)
*G06F 11/10* (2006.01)

(52) U.S. Cl.
CPC ................ *G06F 13/28* (2013.01); *G11C 5/04* (2013.01); *G11C 7/1048* (2013.01); *G11C 7/1054* (2013.01); *G11C 7/222* (2013.01); *G11C 29/52* (2013.01); *G11C 7/10* (2013.01)

(58) Field of Classification Search
CPC ............. G06F 13/1689; G06F 11/1048; G06F 11/073; G06F 11/1008; G06F 11/0793; G06F 11/07; G06F 11/0703; G11C 7/1054; G11C 7/222; G11C 5/04; G11C 7/1048; G11C 29/52; G11C 7/10; H03M 13/157; H03M 13/3715; H03M 13/1545; H03M 13/1525; H03M 13/353; G05B 13/02
See application file for complete search history.

FIG. 4

| NUMBER OF BITS OF INTERNAL DATA (ID<1:K>) | NUMBER OF BITS OF PARITY BITS (P<1:M>) |
|---|---|
| 8 | 4 |
| 16 | 5 |
| 32 | 6 |
| 64 | 7 |
| 128 | 8 |

DATA I/O CIRCUITS AND SEMICONDUCTOR SYSTEMS INCLUDING THE SAME

CROSS-REFERENCE TO RELATED APPLICATIONS

The present application is a continuation application of U.S. application Ser. No. 14/947,126, and claims priority under 35 U.S.C 119(a) to Korean Application No. 10-2015-0106090, filed on Jul. 27, 2015, in the Korean Intellectual Property Office, which is incorporated herein by reference in its entirety as set forth in full.

BACKGROUND

1. Technical Field

Embodiments of the present disclosure generally relate to data input/output (I/O) circuits correcting data errors, semiconductor devices including the same, and semiconductor systems including the same.

2. Related Art

Semiconductor devices are designed and fabricated to include a test mode function for evaluating the operation thereof. That is, various parameters of the semiconductor devices are measured in a test mode at a wafer level or at a package level and the tested semiconductor devices are sorted into good chips or failed chips according to the test results.

Each of the semiconductor devices execute a write operation and a read operation to receive and output a plurality of data through pads, and each semiconductor device is evaluated by sensing logic levels of the data outputted from the pads.

As the semiconductor devices become more highly integrated with the development of fabrication process techniques, the number of failed memory cells in the tested semiconductor devices has increased. Increase of the number of failed memory cells in the tested semiconductor devices may lead to not only reduction of production yield of the semiconductor devices but also difficulty in guaranteeing a large memory capacity for the semiconductor devices. Accordingly, error correction code (ECC) circuits have been widely employed in the semiconductor devices to solve data errors which are due to the failed memory cells.

SUMMARY

Various embodiments are directed to data I/O circuits correcting data errors and semiconductor systems including the same.

According to one embodiment, a semiconductor system includes a first semiconductor device and a second semiconductor device. The first semiconductor device outputs an external strobe signal and external data. The second semiconductor device extracts error information from the external data in synchronization with the external strobe signal during a write operation and outputs the external data and the error information through input/output (I/O) lines during the write operation. In addition, the second semiconductor device corrects errors of internal data with the error information loaded on the I/O lines to output the corrected internal data as the external data during a read operation.

According to another embodiment, a semiconductor system includes a first semiconductor device and a second semiconductor device. The first semiconductor device outputs an external command, an external strobe signal and external data. The second semiconductor device blocks transmission of at least one bit included in the external data in response to the external command during a write operation and extracts error information from the external data in synchronization with the external strobe signal during the write operation. In addition, the second semiconductor device outputs the external data and the error information through input/output (I/O) lines during the write operation and corrects errors of internal data with the error information loaded on the I/O lines to output the corrected internal data as the external data during a read operation.

According to yet another embodiment, the external command is inputted to the second semiconductor device for an operation that the write operation is executed without outputting the external data after the read operation or for an operation that blocks transmission of at least one bit included in the external data.

According to yet another embodiment, the error information includes position information on bits of the external data that are inputted into the second semiconductor device without blocking.

According to yet another embodiment, the I/O lines include first I/O lines, second I/O lines and third I/O lines. The second semiconductor device includes, a peripheral portion, a first memory portion and a second memory portion. The peripheral portion suitable for outputting the external strobe signal and the external data through the first I/O lines in response to the external command, suitable for extracting the error information on the external data in synchronization with the external strobe signal loaded on the first I/O lines, and suitable for outputting the error information through the second and third I/O lines. The first memory portion suitable for storing the error information loaded on the second I/O lines and the internal data generated from the external data during the write operation and suitable for outputting the error information and the internal data through the second I/O lines during the read operation. The second memory portion suitable for storing the error information loaded on the third I/O lines and the internal data generated from the external data during the write operation and suitable for outputting the error information and the internal data through the third I/O lines during the read operation.

According to yet another embodiment, the peripheral portion is suitable for correcting errors of the internal data with the error information loaded on the second I/O lines and suitable for correcting the errors of the internal data with the error information loaded on the third I/O lines, during the read operation.

According to yet another embodiment, the peripheral portion reverses levels of erroneous bits included in the internal data with the error information.

According to yet another embodiment, the peripheral portion includes, an aligner, a first I/O circuit and a second I/O circuit. The aligner suitable for outputting the external strobe signal and the external data through the first I/O lines in response to the external command during the write operation and suitable for aligning data on the first I/O lines in synchronization with a first strobe signal to generate the external strobe signal and the external data during the read operation. The a first I/O circuit suitable for extracting the error information from the data in synchronization with the first strobe signal loaded on the first I/O lines to output the extracted error information through the second I/O lines and suitable for correcting errors of the internal data with the error information loaded on the second I/O lines. The second I/O circuit suitable for extracting the error information from the data in synchronization with the first strobe signal loaded on the first I/O lines to output the extracted error information through the third I/O lines and suitable for correcting errors of the internal data with the error information loaded on the third I/O lines.

According to yet another embodiment, the first I/O circuit includes, a first repeater, a first error corrector, a second repeater and a third repeater. The first repeater suitable for blocking input of at least one of the data according to a masking signal, suitable for generating the internal data from the data in synchronization with the first strobe signal, and suitable for delaying the first strobe signal to generate a first internal strobe signal and a first delayed strobe signal. The first error corrector suitable for generating first correction parity bits including error information on the internal data in synchronization with the first delayed strobe signal, suitable for generating first correction data by correcting erroneous bits of the internal data with the error information in synchronization with the first internal strobe signal, and suitable for generating a first correction strobe signal and a first parity strobe signal by delaying the first delayed strobe signal in response to the external command. The second repeater suitable for outputting the first correction parity bits as first parity bits in synchronization with the first parity strobe signal and suitable for generating a first parity delay strobe signal by delaying the first parity strobe signal. The third repeater suitable for generating a second delayed strobe signal by delaying the first correction strobe signal and suitable for outputting the first correction data as the data.

According to yet another embodiment, the first error corrector is coupled between the first, second, and third repeaters and is disposed adjacent to the first, second, and third repeaters.

According to yet another embodiment, the second I/O circuit includes, a fourth repeater, a second error corrector, a fifth repeater and a sixth repeater. The fourth repeater suitable for blocking input of at least one of the data according to a masking signal, suitable for generating the internal data from the data in synchronization with the first strobe signal, and suitable for delaying the first strobe signal to generate a second internal strobe signal and a third delayed strobe signal. The second error corrector suitable for generating second correction parity bits including error information on the internal data in synchronization with the third delayed strobe signal, suitable for generating second correction data by correcting erroneous bits of the internal data with the error information in synchronization with the second internal strobe signal, and suitable for generating a second correction strobe signal and a second parity strobe signal by delaying the third delayed strobe signal in response to the external command. The fifth repeater suitable for outputting the second correction parity bits as second parity bits in synchronization with the second parity strobe signal and suitable for generating a second parity delay strobe signal by delaying the second parity strobe signal. The sixth repeater suitable for generating a fourth delayed strobe signal by delaying the second correction strobe signal and suitable for outputting the second correction data as the data.

According to yet another embodiment, the second error corrector is coupled between the fourth, fifth, and sixth repeaters and is disposed adjacent to the fourth, fifth, and sixth repeaters.

According to yet another embodiment, A data input/output (I/O) circuit includes a first repeater, an error corrector, a second repeater and a third repeater. The first repeater suitable for receiving a first strobe signal and data through first I/O lines to generate internal data from the data in synchronization with the first strobe signal during a write operation, suitable for outputting the internal data through second I/O lines during the write operation, and suitable for delaying the first strobe signal to output the delayed first strobe signal as a first delayed strobe signal through the second I/O lines during the write operation. The error corrector suitable for generating correction parity bits including error information on the internal data in synchronization with the first delayed strobe signal during the write operation, suitable for generating correction data by correcting erroneous bits of the internal data with the error information during a read operation, and suitable for generating a parity strobe signal by delaying the first delayed strobe signal. The second repeater suitable for outputting the correction parity bits as parity bits through the second I/O lines in synchronization with the parity strobe signal and suitable for generating a parity delay strobe signal by delaying the parity strobe signal. The third repeater suitable for generating a second delayed strobe signal by delaying a correction strobe signal and suitable for outputting the correction data as the data through the first I/O lines.

According to yet another embodiment, the error information includes position information on erroneous bits included in the data.

According to yet another embodiment, the error corrector includes, a first buffer, a second buffer, an error extractor, a position signal generator and a pulse signal generator. The first buffer suitable for outputting the parity bits as internal parity bits in response to the first delayed strobe signal and a second strobe signal. The a second buffer suitable for outputting the internal data as the correction data in response to the first delayed strobe signal and the second strobe signal, wherein the second buffer reverses levels of erroneous bits of the internal data to correct the internal data in response to a pulse signal and outputs the corrected internal data as the correction data. The an error extractor suitable for extracting error information from the correction data to generate the correction parity bits or suitable for outputting the internal parity bits as the correction parity bits. The a position signal generator suitable for decoding the correction parity bits to generate a position signal. The a pulse signal generator suitable for generating the pulse signal including a pulse that occurs in response to the position signal.

According to yet another embodiment, the pulse signal is enabled at a point of time that an erroneous bit of the internal data is inputted.

According to yet another embodiment, the first buffer includes, an initializer, a first transmitter and a second transmitter. The initializer suitable for initializing a first node to a level of a power supply voltage in response to the first delayed strobe signal. The first transmitter suitable for inversely buffering the parity bits to output the inversely buffered signal of the parity bits to the first node in response to the second strobe signal. The second transmitter suitable for latching a signal of the first node and suitable for inversely buffering the latched signal to generate the internal parity bits.

According to yet another embodiment, the second buffer includes, a third transmitter, a fourth transmitter and a fifth transmitter. The third transmitter suitable for inversely buffering the internal data to output the inversely buffered internal data to a second node if the first delayed strobe signal or the second strobe signal is inputted to the third transmitter. The fourth transmitter suitable for buffering the internal data in response to the pulse signal to output the buffered internal data to the second node. The fifth transmitter suitable for latching a signal of the second node and suitable for inversely buffering the latched signal to generate the correction data.

According to yet another embodiment, a semiconductor device includes, a first memory portion, a second memory portion and a peripheral portion. The a first memory portion including at least one bank. The a second memory portion including at least one bank. The peripheral portion coupled between the first memory portion and the second memory portion through input/output (I/O) lines, and configured to receive an external strobe signal and external data. The peripheral portion is configured for extracting error information from the external data in synchronization with the external strobe signal during a write operation, configured for outputting the external data and the error information through the I/O lines during the write operation, and configured for correcting errors of internal data with the error information loaded on the I/O lines to output the corrected internal data as the external data during a read operation.

According to yet another embodiment, the error information includes position information on erroneous bits included in the external data.

According to yet another embodiment, the I/O lines include first I/O lines, second I/O lines and third I/O lines. The peripheral portion is suitable for outputting the external strobe signal and the external data through the first I/O lines, suitable for extracting the error information on the external data in synchronization with the external strobe signal loaded on the first I/O lines, and suitable for outputting the error information through the second and third I/O lines. The first memory portion suitable for storing the error information loaded on the second I/O lines and the internal data generated from the external data during the write operation and suitable for outputting the error information and the internal data through the second I/O lines during the read operation. The second memory portion suitable for storing the error information loaded on the third I/O lines and the internal data generated from the external data during the write operation and suitable for outputting the error information and the internal data through the third I/O lines during the read operation.

According to yet another embodiment, a semiconductor device includes a first memory portion, a second memory portion and a peripheral portion. The first memory portion including at least one bank. The a second memory portion including at least one bank. The peripheral portion coupled between the first memory portion and the second memory portion through input/output (I/O) lines, and configured to receive an external command, external strobe signal, and external data. The peripheral portion is suitable for blocking transmission of at least one bit included in the external data in response to the external command during a write operation, suitable for extracting error information from the external data in synchronization with the external strobe signal during the write operation, suitable for outputting the external data and the error information through the I/O lines during the write operation, and suitable for correcting errors of internal data with the error information loaded on the I/O lines to output the corrected internal data as the external data during a read operation.

According to yet another embodiment, the external command is received by the peripheral portion for an operation that the write operation is executed without outputting the external data after the read operation or for an operation that blocks transmission of at least one bit included in the external data.

According to yet another embodiment, the error information includes position information on bits of the external data that are inputted into the peripheral portion without blocking.

According to yet another embodiment, the I/O lines include first I/O lines, second I/O lines and third I/O lines. The peripheral portion is suitable for outputting the external strobe signal and the external data through the first I/O lines in response to the external command, suitable for extracting the error information on the external data in synchronization with the external strobe signal loaded on the first I/O lines, and suitable for outputting the error information through the second and third I/O lines. The first memory portion is suitable for storing the error information loaded on the second I/O lines and the internal data generated from the external data during the write operation and suitable for outputting the error information and the internal data through the second I/O lines during the read operation. The second memory portion is suitable for storing the error information loaded on the third I/O lines and the internal data generated from the external data during the write operation and suitable for outputting the error information and the internal data through the third I/O lines during the read operation.

According to yet another embodiment, a data I/O circuit includes a repeater and an error corrector. The repeater receives a first strobe signal and data through first I/O lines to output the data as internal data through second I/O lines in synchronization with the first strobe signal and delays the first strobe signal to output the delayed first strobe signal as a first delayed strobe signal through the second I/O lines. The error corrector generates correction parity bits including error information on the internal data in synchronization with the first delayed strobe signal during a write operation. In addition, the error corrector generates correction data by correcting erroneous bits of the internal data with the error information during a read operation and generates a parity strobe signal by delaying the first delayed strobe signal.

BRIEF DESCRIPTION OF THE DRAWINGS

FIG. 4 is a table illustrating the number of bits of parity bits which are set by an error corrector included in the first I/O circuit of FIG. 2.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
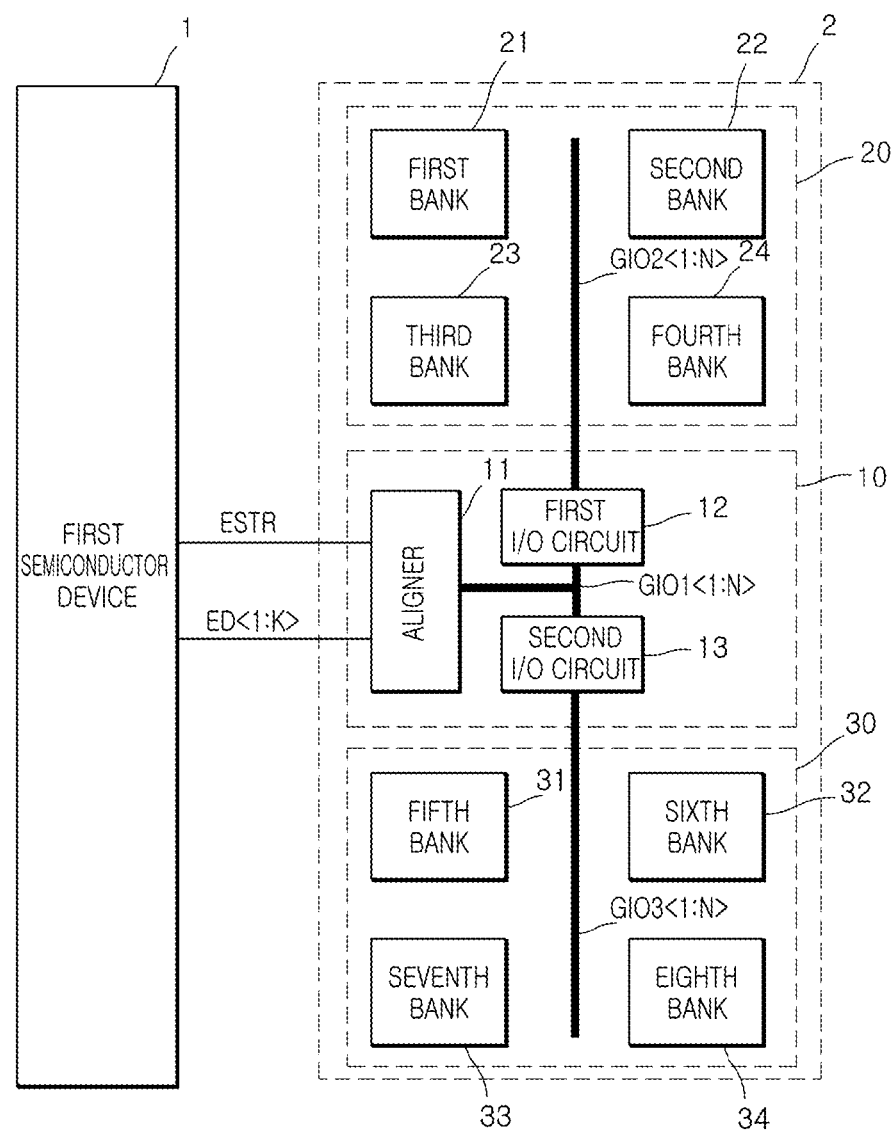
FIG. 1 is a block diagram illustrating a semiconductor system according to an embodiment of the present disclosure.

Referring to FIG. 1, a semiconductor system according to an embodiment may include a first semiconductor device 1 and a second semiconductor device 2. The second semiconductor device 2 may include a peripheral portion 10, a first memory portion 20 and a second memory portion 30.

The first semiconductor device 1 may output an external strobe signal ESTR and external data ED<1:K>. The external strobe signal ESTR may be set to be a signal for strobing data. The external strobe signal ESTR may be transmitted through lines that transmit at least one group of addresses, commands and data. The number of bits included in the external data ED<1:K> may be set to be different according to the embodiments. The external data ED<1:K> may be transmitted through lines that transmit at least one group of addresses, commands and data. In some embodiments, the external data ED<1:K> may be transmitted through a single transmission line.

The peripheral portion 10 may include an aligner 11, a first I/O circuit 12 and a second I/O circuit 13.

The aligner 11 may output the external strobe signal ESTR as a first strobe signal (STR1 of FIG. 2) through first I/O lines GIO1<1:N> and may output the external data ED<1:K> as data (D<1:K> of FIG. 2) through the first I/O lines GIO1<1:N>, during a write operation. The aligner 11 may output the first strobe signal STR1 as the external strobe signal ESTR during a read operation. During the read operation, the aligner 11 may align the data D<1:K> on the first I/O lines GIO1<1:N> to output the aligned data D<1:K> as the external data ED<1:K> in synchronization with the first strobe signal STR1. The number of the first I/O lines GIO1<1:N> may be set to be equal to or greater than a total number of bits of the external strobe signal ESTR and the external data ED<1:K>.

The first I/O circuit 12 may extract error information from the data D<1:K> in synchronization with the first strobe signal STR1 loaded on the first I/O lines GIO1<1:N> to output the error information through second I/O lines GIO2<1:N> and may generate internal data (ID<1:K> of FIG. 2) from the data D<1:K>, during the write operation. The first I/O circuit 12 may correct errors of the internal data (ID<1:K>) with the error information loaded on the second I/O lines GIO2<1:N> during the read operation. The number of the second I/O lines GIO2<1:N> may be set to be equal to or greater than a total number of bits of the first strobe signal STR1, the error information and the internal data (ID<1:K>). The first I/O circuit 12 may be realized using a data I/O circuit that executes a data I/O operation with the first memory portion 20.

The second I/O circuit 13 may extract error information from the data D<1:K> in synchronization with the first strobe signal STR1 loaded on the first I/O lines GIO1<1:N> to output the error information through third I/O lines GIO3<1:N> and may generate internal data (not illustrated) from the data D<1:K>, during the write operation. The second I/O circuit 13 may correct errors of the internal data (not illustrated) with the error information loaded on the third I/O lines GIO3<1:N> during the read operation. The number of the third I/O lines GIO3<1:N> may be set to be equal to or greater than a total number of bits of the first strobe signal STR1, the error information and the internal data (not illustrated). The second I/O circuit 13 may be realized using a data I/O circuit that executes a data I/O operation with the second memory portion 30.

The first memory portion 20 may include first to fourth banks 21~24. The first memory portion 20 may store the error information and the internal data ID<1:K> loaded on the second I/O lines GIO2<1:N> during the write operation and may output the error information and the internal data ID<1:K> stored therein through the second I/O lines GIO2<1:N> during the read operation.

The second memory portion 30 may include fifth to eighth banks 31~34. The second memory portion 30 may store the error information and the internal data (not illustrated) loaded on the third I/O lines GIO3<1:N> during the write operation and may output the error information and the internal data (not illustrated) stored therein through the third I/O lines GIO3<1:N> during the read operation.

The first and second memory portions 20 and 30 may be realized using volatile memory devices or nonvolatile memory devices according to the embodiments. Each of the first and second memory portions 20 and 30 may be divided into a first region in which the internal data are stored and a second region in which the error information is stored.

Figure 2:
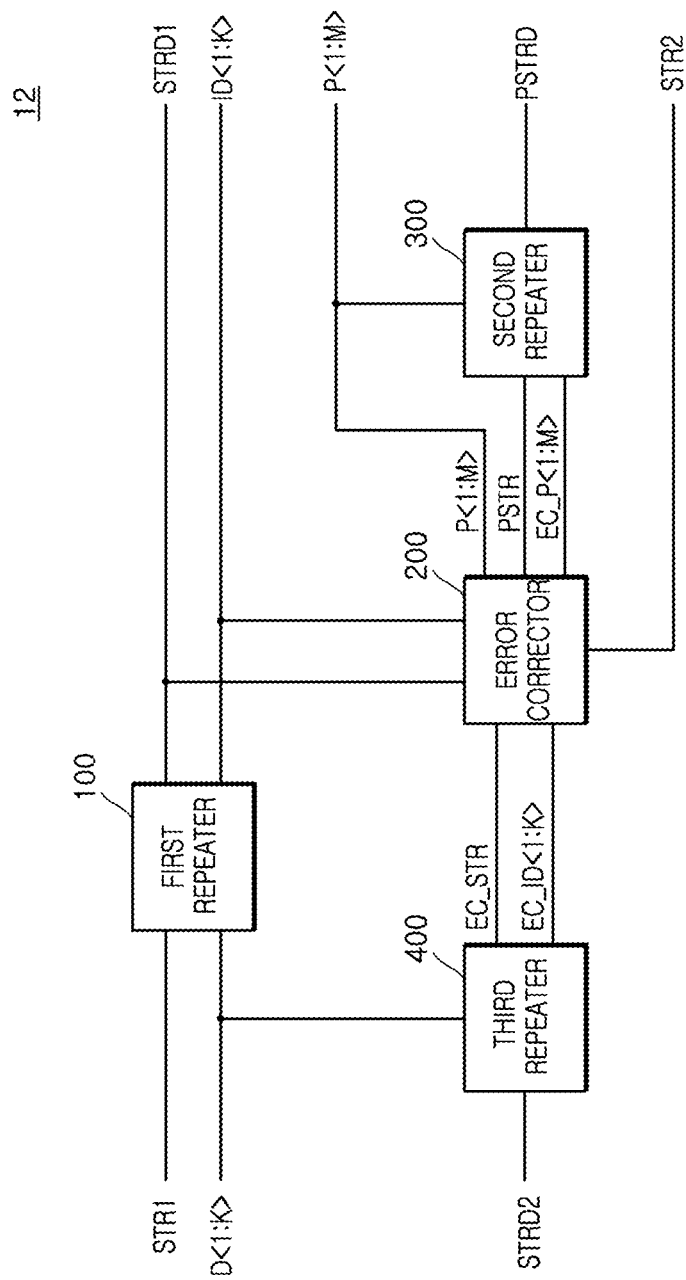
FIG. 2 is a block diagram illustrating a first I/O circuit included in the semiconductor system of FIG. 1.

Referring to FIG. 2, the first I/O circuit 12 may include a first repeater 100, an error corrector 200, a second repeater 300 and a third repeater 400.

The first repeater 100 may generate the internal data ID<1:K> from the data D<1:K> in synchronization with the first strobe signal STR1 and may generate a first delayed strobe signal STRD1 by delaying the first strobe signal STR1. The external strobe signal ESTR may be transmitted through any one of the first I/O lines GIO1<1:N> to generate the first strobe signal STR1. The external data ED<1:K> may be transmitted through any one of the first I/O lines GIO1<1:N> to generate the data D<1:K>. If the external data ED<1:K> are inputted in series to the second semiconductor device 2, the external data ED<1:K> may be transmitted through any one of the first I/O lines GIO1<1:N> to generate the data D<1:K>. The first delayed strobe signal STRD1 may be transmitted through any one of the second I/O lines GIO2<1:N>. The internal data ID<1:K> may be transmitted through the second I/O lines GIO2<1:N>.

The error corrector 200 may generate correction parity bits EC_P<1:M> including the error information on the internal data ID<1:K> in synchronization with the first delayed strobe signal STRD1 during the write operation and may generate correction data EC_ID<1:K> by correcting erroneous bits of the internal data ID<1:K> with the error information during the read operation. The error corrector 200 may generate a parity strobe signal PSTR by delaying the first delayed strobe signal STRD1 during the write operation and may generate a correction strobe signal EC_STR by delaying a second strobe signal STR2 during the read operation. During the read operation, the error information may correspond to parity bits P<1:M> which are outputted from the memory portion after the correction parity bits EC_P<1:M> are transmitted as the parity bits P<1:M> and are stored in the memory portion during the write operation. The number 'M' of bits of the parity bits P<1:M> including the error information may be determined by the number 'K' of bits of the internal data ID<1:K> and may be set to be different according to the embodiments. The error corrector 200 may be realized using an error correction code (ECC) circuit.

The second repeater 300 may output the correction parity bits EC_P<1:M> as the parity bits P<1:M> in synchronization with the parity strobe signal PSTR and may generate a parity delay strobe signal PSTRD by delaying the parity strobe signal PSTR in synchronization with the parity strobe signal PSTR, during the write operation. The second repeater 300 may output the correction parity bits EC_P<1: M> as the parity bits P<1:M>, and the parity bits P<1:M> may be transmitted through the second I/O lines GIO2<1: N>. The parity delay strobe signal PSTRD may be transmitted through any one of the second I/O lines GIO2<1:N>.

The third repeater 400 may generate a second delayed strobe signal STRD2 by delaying the correction strobe signal EC_STR and may output the correction data EC_ID<1:K> as the data D<1:K>, during the read operation. The third repeater 400 may output the correction strobe signal EC_STR as the second delayed strobe signal STRD2, and the second delayed strobe signal STRD2 may be loaded on any one of the first I/O lines GIO1<1:N>. During the read operation, the third repeater 400 may output the correction data EC_ID<1:K> as the data D<1:K> and the data D<1:K> may be loaded on the first I/O lines GIO1<1:N>.

The second I/O circuit 13 of the semiconductor system illustrated in FIG. 1 may be realized to have substantially the same configuration as the first I/O circuit 12 described with reference FIG. 2 except input and output signals thereof. Thus, a detailed description of the second I/O circuit 13 will be omitted hereinafter.

Figure 3:
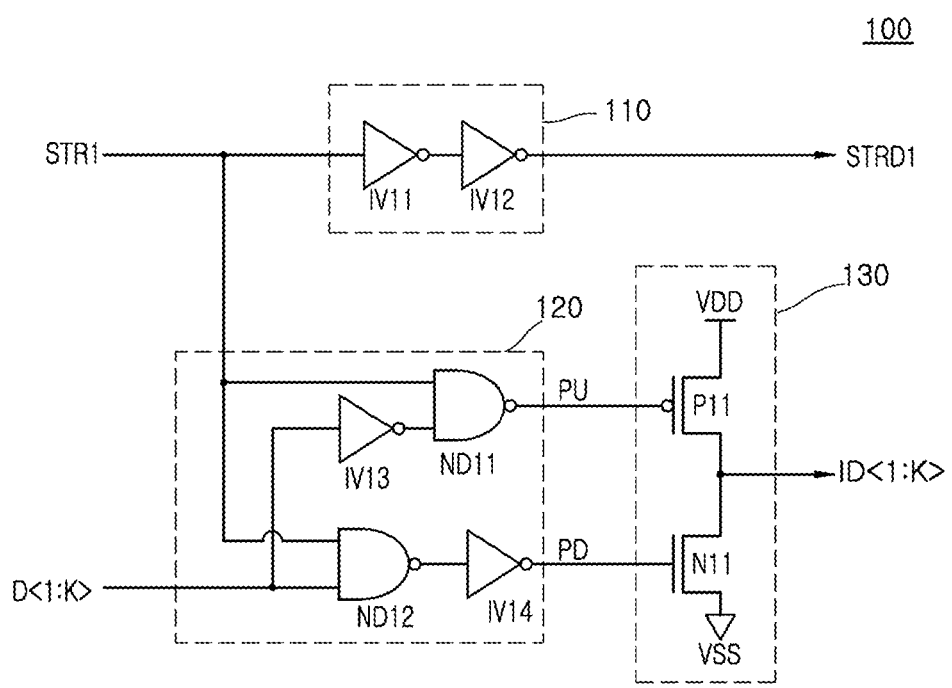
FIG. 3 is a circuit diagram illustrating a first repeater included in the first I/O circuit of FIG. 2.

Referring to FIG. 3, the first repeater 100 may include a buffer 110, a pull-up/pull-down signal generator 120 and a driver 130.

The buffer 110 may be realized using inverters IV11 and IV12 and may delay the first strobe signal STR1 to generate the first delayed strobe signal STRD1.

The pull-up/pull-down signal generator 120 may be realized to include NAND gates ND11 and ND12 and inverters IV13 and IV14 and may generate a pull-up signal PU and a pull-down signal PD according to a level of the data D<1: K>.

The driver 130 may be realized to include a PMOS transistor P11 and an NMOS transistor N11 and may drive the internal data ID<1:K> in response to the pull-up signal PU and the pull-down signal PD.

FIG. 4 is a table illustrating the number of bits of the parity bits P<1:M> which are set by the error corrector 200 included in the first I/O circuit 12 of FIG. 2.

Various examples of the number 'M' of bits of the parity bits P<1:M> set by the number 'K' of bits of the internal data ID<1:K> will be described hereinafter with reference to FIG. 4.

The number 'M' of bits of the parity bits P<1:M> may be set to be four if the number 'K' of bits of the internal data ID<1:K> is set to be eight.

The number 'M' of bits of the parity bits P<1:M> may be set to be five if the number 'K' of bits of the internal data ID<1:K> is set to be sixteen.

The number 'M' of bits of the parity bits P<1:M> may be set to be six if the number 'K' of bits of the internal data ID<1:K> is set to be thirty two.

The number 'M' of bits of the parity bits P<1:M> may be set to be seven if the number 'K' of bits of the internal data ID<1:K> is set to be sixty four.

The number 'M' of bits of the parity bits P<1:M> may be set to be eight if the number 'K' of bits of the internal data ID<1:K> is set to be one hundred and twenty eight.

Figure 5:
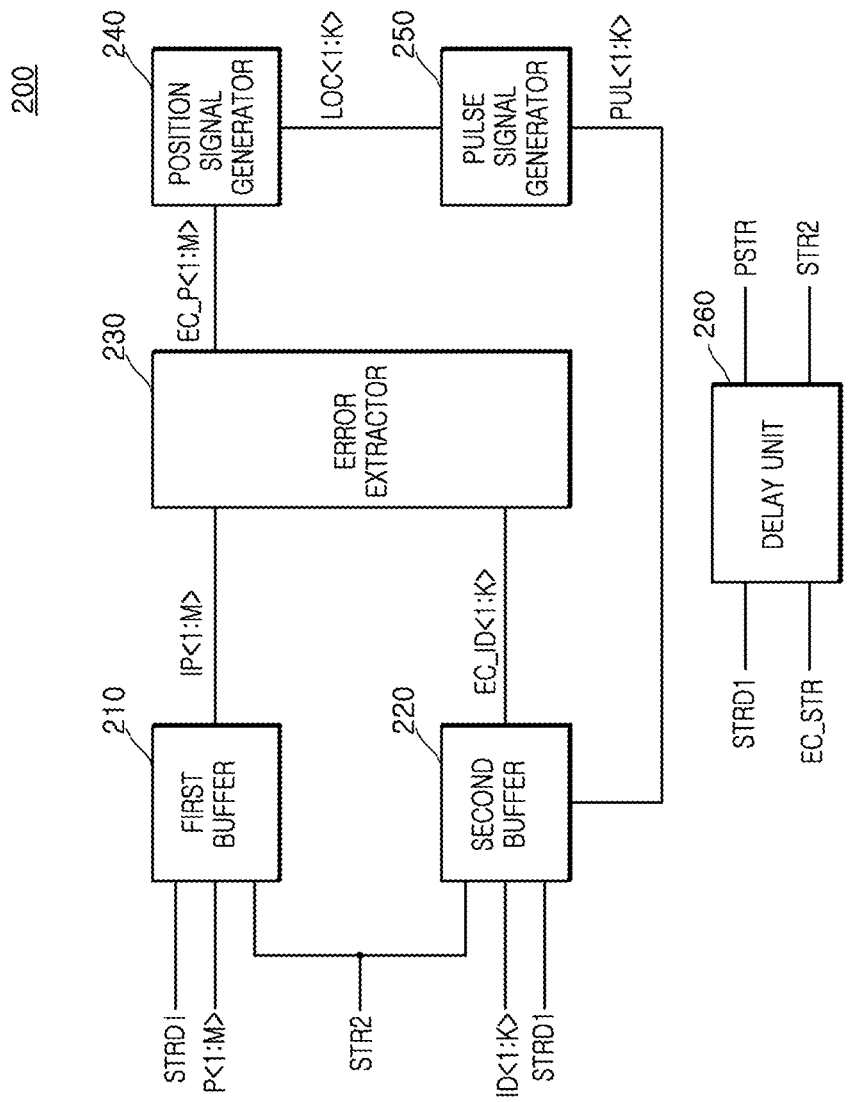
FIG. 5 is a block diagram illustrating an error corrector included in the first I/O circuit of FIG. 2.

Referring to FIG. 5, the error corrector 200 may include a first buffer 210, a second buffer 220, an error extractor 230, a position signal generator 240, a pulse signal generator 250 and a delay unit 260.

The first buffer 210 may output the parity bits P<1:M> as internal parity bits IP<1:M> in response to the first delayed strobe signal STRD1 and the second strobe signal STR2.

The second buffer 220 may output the internal data ID<1:K> as the correction data EC_ID<1:K> in response to the first delayed strobe signal STRD1 and the second strobe signal STR2. In such an example, the second buffer 220 may reverse levels of erroneous bits of the internal data ID<1:K> to correct the internal data ID<1:K> and may output the corrected signals of the internal data ID<1:K> as the correction data EC_ID<1:K>, in response to a pulse signal PUL<1:K>.

The error extractor 230 may extract error information from the correction data EC_ID<1:K> to generate the correction parity bits EC_P<1:M> during the write operation and may output the internal parity bits IP<1:M> as the correction parity bits EC_P<1:M> during the read operation.

The position signal generator 240 may decode the correction parity bits EC_P<1:M> to generate a position signal LOC<1:K>. The position signal LOC<1:K> may include position information on erroneous bits of the correction data EC_ID<1:K>.

The pulse signal generator 250 may generate the pulse signal PUL<1:K> including a pulse that occurs in response to the position signal LOC<1:K>.

The delay unit 260 may delay the first delayed strobe signal STRD1 to generate the parity strobe signal PSTR and may delay the second strobe signal STR2 to generate the correction strobe signal EC_STR.

Figure 6:
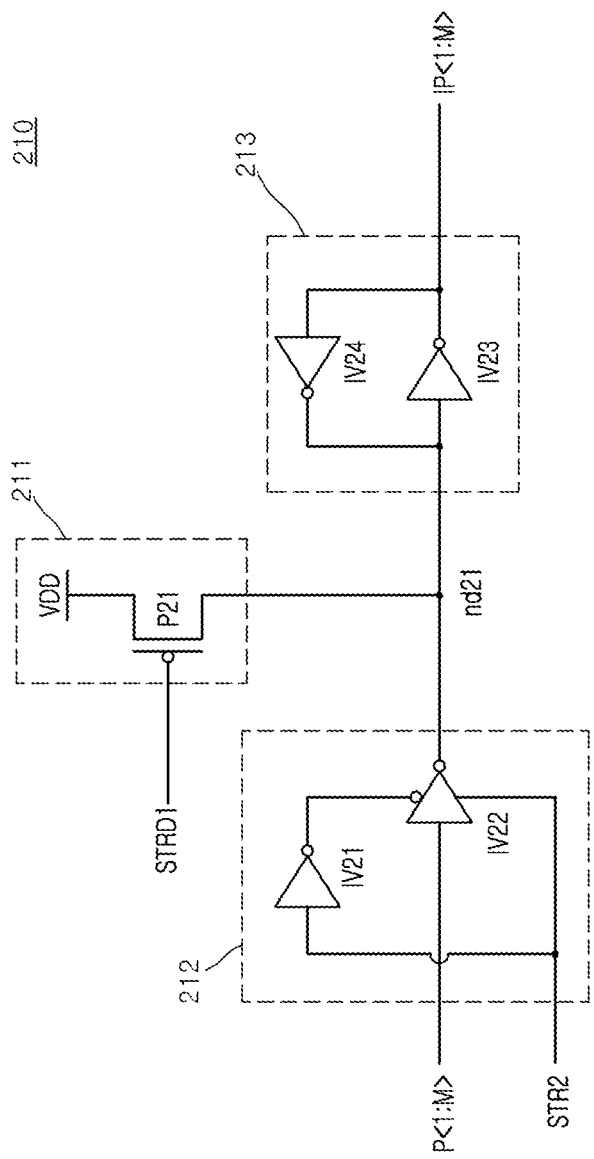
FIG. 6 is a circuit diagram illustrating a first buffer included in the error corrector of FIG. 5.

Referring to FIG. 6, the first buffer 210 may include an initializer 211, a first transmitter 212 and a second transmitter 213.

The initializer 211 may be realized using a PMOS transistor P21 coupled between a power supply voltage VDD terminal and a node ND21 and may drive the node ND21 to a level of the power supply voltage VDD in response to the first delayed strobe signal STRD1.

The first transmitter 212 may be realized to include inverters IV21 and IV22. The first transmitter 212 may inversely buffer the parity bits P<1:M> to output the inversely buffered signals of the parity bits P<1:M> to the node ND21, in response to the second strobe signal STR2. The inverter IV22 may be realized using a three-phase inverter which is turned on in response to the second strobe signal STR2.

The second transmitter 213 may be realized to include inverters IV23 and IV24. The second transmitter 213 may latch a signal of the node ND21 and may inversely buffer the latched signal of the node ND21 to generate the internal parity bits IP<1:M>.

For example, the first buffer 210 may output the parity bits P<1:M> as the internal parity bits IP<1:M> in response to the first delayed strobe signal STRD1 and the second strobe signal STR2.

Figure 7:
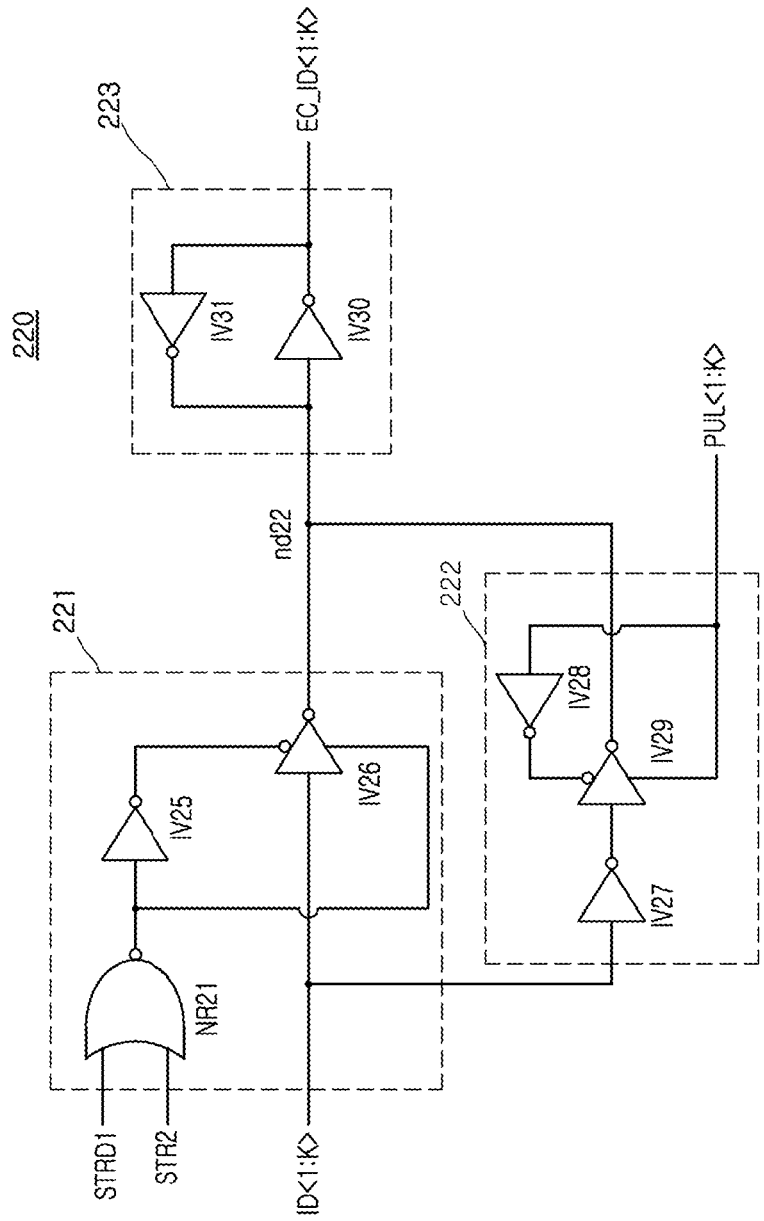
FIG. 7 is a circuit diagram illustrating a second buffer included in the error corrector of FIG. 5.

Referring to FIG. 7, the second buffer 220 may include a third transmitter 221, a fourth transmitter 222 and a fifth transmitter 223.

The third transmitter 221 may be realized to include a NOR gate NR21 and inverters IV25 and IV26. The third transmitter 221 may inversely buffer the internal data ID<1:K> to output the inversely buffered signals of the internal data ID<1:K> to a node ND22 if the first delayed strobe signal STRD1 or the second strobe signal STR2 is inputted thereto. The inverter IV26 may be realized using a three-phase inverter which is turned on in response to an output signal of the NOR gate NR21.

The fourth transmitter 222 may be realized to include inverters IV27, IV28 and IV29. The fourth transmitter 222 may buffer the internal data ID<1:K> to output the buffered signals of the internal data ID<1:K> to the node ND22 if a pulse of the pulse signal PUL<1:K> is inputted thereto. The inverter IV29 may be realized using a three-phase inverter which is turned on in response to the pulse signal PUL<1:K>.

The fifth transmitter 223 may be realized to include inverters IV30 and IV31. The fifth transmitter 223 may latch a signal of the node ND22 and may inversely buffer the latched signal of the node ND22 to generate the correction data EC_ID<1:K>.

For example, the second buffer 220 may output the internal data ID<1:K> as the correction data EC_ID<1:K> in response to the first delayed strobe signal STRD1 and the second strobe signal STR2. In such an example, the second buffer 220 may reverse levels of erroneous bits of the internal data ID<1:K> to correct the internal data ID<1:K> in response to the pulse signal PUL<1:K>.

An operation of the semiconductor system having an aforementioned configuration will be described hereinafter with reference to FIGS. 1 to 7 in conjunction with an example in which the write operation and the read operation are applied to the first memory portion 20 to correct erroneous bits of the external data ED<1:K>.

First, if the write operation of the semiconductor system is executed, the first semiconductor device 1 may output the external strobe signal ESTR and the external data ED<1:K>.

The aligner 11 may output the external strobe signal ESTR as the first strobe signal STR1 through the first I/O lines GIO1<1:N> and may output the external data ED<1:K> as the data D<1:K> through the first I/O lines GIO1<1:N>.

The first repeater 100 of the first I/O circuit 12 may generate the internal data ID<1:K> from the data D<1:K> and may output the internal data ID<1:K> through the second I/O lines GIO2<1:N>, in synchronization with the first strobe signal STR1. The first repeater 100 may delay the first strobe signal STR1 to generate the first delayed strobe signal STRD1 and the first delayed strobe signal STRD1 may be outputted through the second I/O lines GIO2<1:N>.

The error corrector 200 may generate the correction parity bits EC_P<1:M> including error information on the internal data ID<1:K> in synchronization with the first delayed strobe signal STRD1 and may delay the first delayed strobe signal STRD1 to generate the parity strobe signal PSTR in synchronization with the first delayed strobe signal STRD1.

The second repeater 300 may output the correction parity bits EC_P<1:M> as the parity bits P<1:M> through the second I/O lines GIO2<1:N> in synchronization with the parity strobe signal PSTR. The second repeater 300 may delay the parity strobe signal PSTR to generate the parity delay strobe signal PSTRD, and the parity delay strobe signal PSTRD may be outputted through the second I/O lines GIO2<1:N>.

The first memory portion 20 may store the parity bits P<1:M> and the internal data ID<1:K> loaded on the second I/O lines GIO2<1:N>.

Next, if the read operation of the semiconductor system is executed, the first memory portion 20 may output the parity bits P<1:M> and the internal data ID<1:K> through the second I/O lines GIO2<1:N>.

The error corrector 200 may correct erroneous bits of the internal data ID<1:K> with the parity bits P<1:M> to generate the correction data EC_ID<1:K> and may delay the second strobe signal STR2 to generate the correction strobe signal EC_STR.

The third repeater 400 may delay the correction strobe signal EC_STR to generate the second delayed strobe signal STRD2 and may output the correction data EC_ID<1:K> as the data D<1:K> through the first I/O lines GIO1<1:N>.

The aligner 11 may output the second delayed strobe signal STRD2 as the external strobe signal ESTR and may align the data D<1:K> loaded on the first I/O lines GIO1<1:N> to output the aligned data of the data D<1:K> as the external data ED<1:K>, in synchronization with the second delayed strobe signal STRD2.

The first semiconductor device 1 may receive the external data ED<1:K> having corrected bits in synchronization with the external strobe signal ESTR.

The semiconductor system according to an embodiment may extract error information on data inputted thereto and may correct erroneous bits of the data according to the error information to prevent data errors. In addition, an ECC circuit may be disposed to be adjacent to a repeater that drives I/O lines through which signals of a semiconductor device of the semiconductor system are transmitted. Thus, the number of the I/O lines on which the error information is loaded may be reduced to increase the integration density of the semiconductor device.

Figure 8:
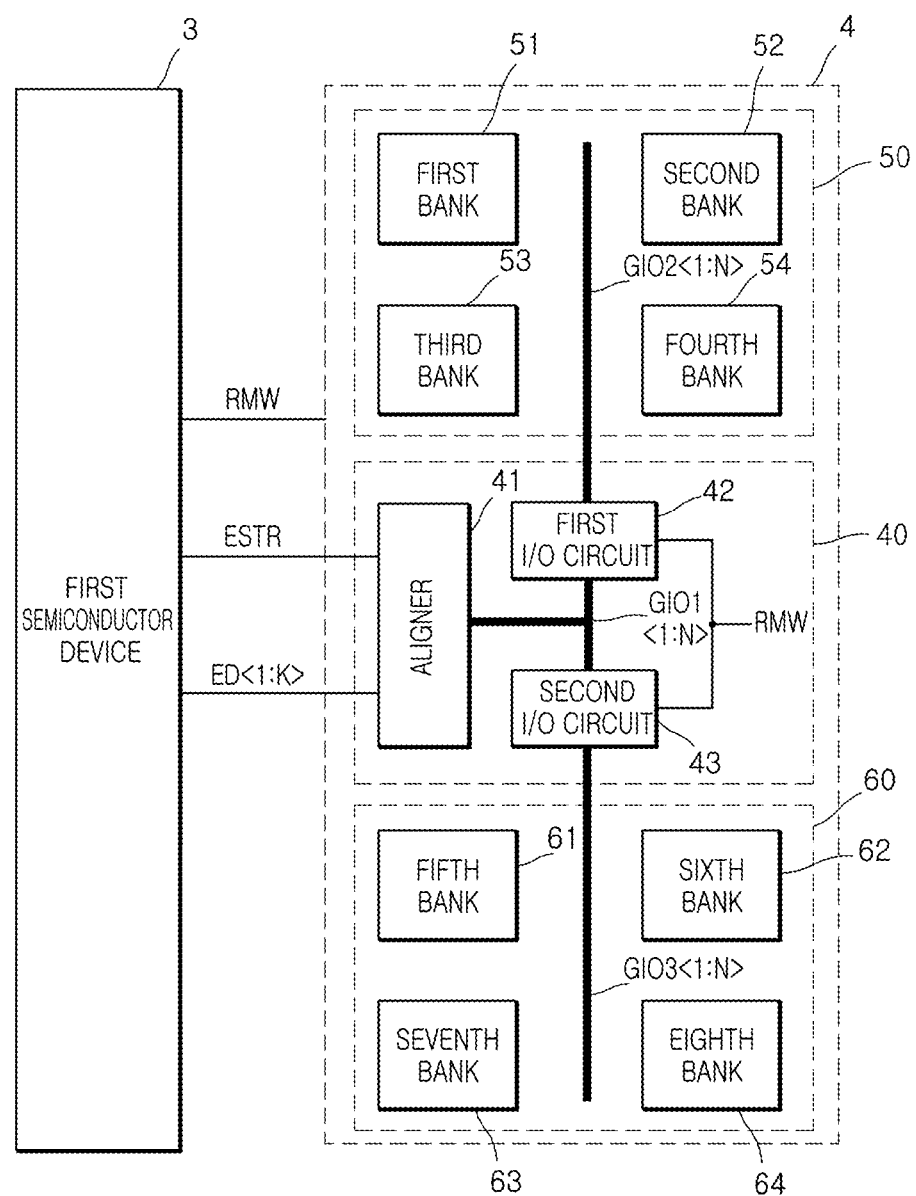
FIG. 8 is a block diagram illustrating a semiconductor system according to an embodiment of the present disclosure.

Referring to FIG. 8 a semiconductor system according to an embodiment may include a first semiconductor device 3 and a second semiconductor device 4. The second semiconductor device 4 may include a peripheral portion 40, a first memory portion 50 and a second memory portion 60.

The first semiconductor device 3 may output an external command RMW, an external strobe signal ESTR and external data ED<1:K>. The external command RMW may be a command inputted to the second semiconductor device 4 for a read modification write (RMW) operation that a write operation is executed without outputting the external data after a read operation or for a data masking operation that prevents specific bits of the external data from being transmitted. The external strobe signal ESTR may be set to be a signal for strobing data. The external command RMW and the external strobe signal ESTR may be transmitted through lines that transmit at least one group of addresses, commands and data. The number of bits included in the external data ED<1:K> may be set to be different according to the embodiments. The external data ED<1:K> may be transmitted through lines that transmit at least one group of addresses, commands and data. In some embodiments, the external data ED<1:K> may be transmitted through a single transmission line.

According to the RMW operation, data stored in selected memory cells may be read out during the read operation and opposite data to the data read out from the selected memory cells may be written into the selected memory cells after the read operation terminates.

According to the data masking operation, transmission of specific data may be blocked during the read operation or the write operation so that the specific data are not read out or written into the memory cells.

The peripheral portion 10 may include an aligner 41, a first I/O circuit 42 and a second I/O circuit 43.

The aligner 41 may output the external strobe signal ESTR as a first strobe signal (STR1 of FIG. 9) through first I/O lines GIO1<1:N> and may output the external data ED<1:K> as data (D<1:K> of FIG. 9) through the first I/O lines GIO1<1:N>, during the write operation. The aligner 41 may output the first strobe signal STR1 as the external strobe signal ESTR during the read operation. During the read operation, the aligner 41 may align the data D<1:K> on the first I/O lines GIO1<1:N> to output the aligned data D<1:K> as the external data ED<1:K> in synchronization with the first strobe signal STR1. The number of the first I/O lines GIO1<1:N> may be set to be equal to or greater than a total number of bits of the external strobe signal ESTR and the external data ED<1:K>.

The first I/O circuit 42 may extract error information from the data D<1:K> in synchronization with the first strobe signal STR1 loaded on the first I/O lines GIO1<1:N> in response to the external command RMW to output the error information through second I/O lines GIO2<1:N> during the write operation. The first I/O circuit 42 may correct errors of the internal data (ID<1:K>) with the error information loaded on the second I/O lines GIO2<1:N> during the read operation. The number of the second I/O lines GIO2<1:N> may be set to be equal to or greater than a total number of bits of the first strobe signal STR1, the error information and the internal data (ID<1:K>).

The second I/O circuit 43 may extract error information from the data D<1:K> in synchronization with the first strobe signal STR1 loaded on the first I/O lines GIO1<1:N> to output the error information through third I/O lines GIO3<1:N> in response to the external command RMW during the write operation. The second I/O circuit 43 may correct errors of internal data (not shown) with the error information loaded on the third I/O lines GIO3<1:N> during the read operation. The number of the third I/O lines GIO3<1:N> may be set to be equal to or greater than a total number of bits of the first strobe signal STR1, the error information and the internal data (not illustrated).

The first memory portion 50 may include first to fourth banks 51~54. The first memory portion 50 may store the error information and the internal data ID<1:K> loaded on the second I/O lines GIO2<1:N> during the write operation and may output the error information and the internal data ID<1:K> stored therein through the second I/O lines GIO2<1:N> during the read operation.

The second memory portion 60 may include fifth to eighth banks 61~64. The second memory portion 60 may store the error information and the internal data (not illustrated) loaded on the third I/O lines GIO3<1:N> during the write operation and may output the error information and the internal data (not illustrated) stored therein through the third I/O lines GIO3<1:N> during the read operation.

The first and second memory portions 50 and 60 may be realized using volatile memory devices or nonvolatile memory devices according to the embodiments. Each of the first and second memory portions 50 and 60 may be divided into a first region in which the internal data are stored and a second region in which the error information is stored.

Figure 9:
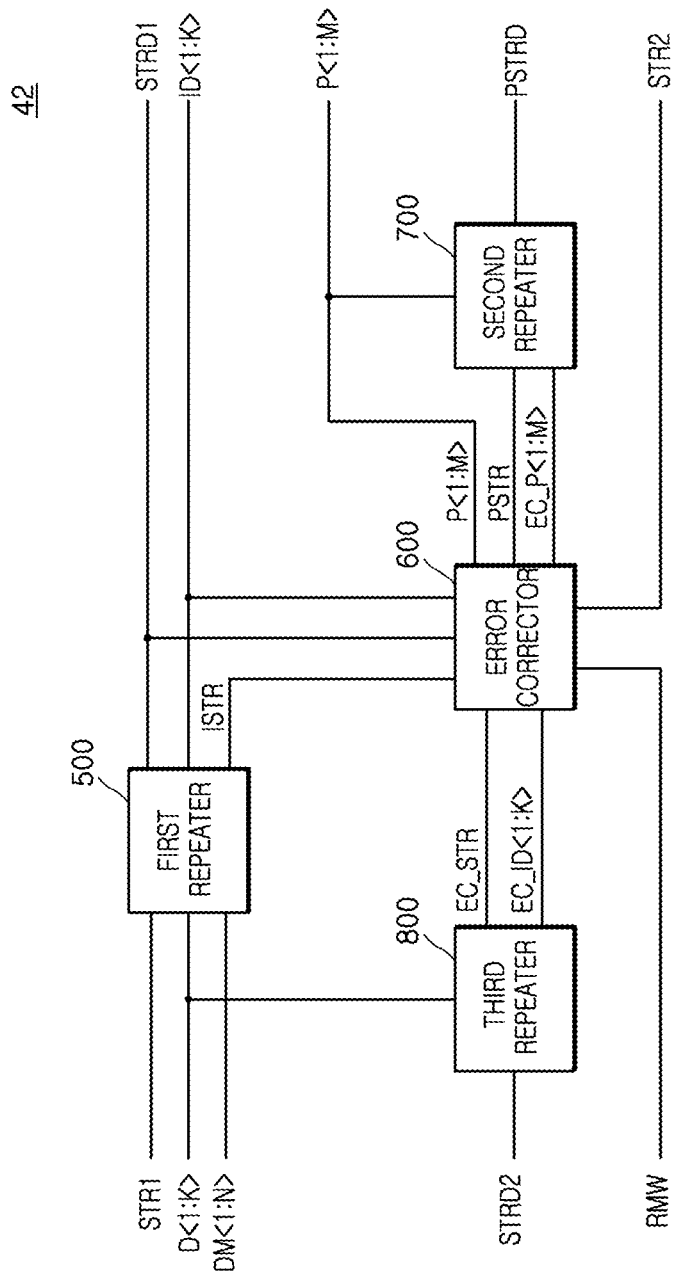
FIG. 9 is a block diagram illustrating a first I/O circuit included in the semiconductor system of FIG. 8.

Referring to FIG. 9, the first I/O circuit 42 may include a first repeater 500, an error corrector 600, a second repeater 700 and a third repeater 800.

The first repeater 500 may block that at least one of the data D<1:K> is outputted therefrom, according to a masking signal DM<1:N>. The first repeater 500 may generate the internal data ID<1:K> from the data D<1:K> in synchronization with the first strobe signal STR1 and may delay the first strobe signal STR1 to generate a first delayed strobe signal STRD1. The masking signal DM<1:N> may be a signal for blocking transmission of specific bits included in the data D<1:K> and may be supplied from an external device or generated in the semiconductor device. The external strobe signal ESTR may be transmitted through any one of the first I/O lines GIO1<1:N> to generate the first strobe signal STR1. The external data ED<1:K> may be transmitted through any one of the first I/O lines GIO1<1:N> to generate the data D<1:K>. If the external data ED<1:K> are inputted in series to the second semiconductor device 4, the external data ED<1:K> may be transmitted through any one of the first I/O lines GIO1<1:N> to generate the data D<1:K>. The first delayed strobe signal STRD1 may be transmitted through any one of the second I/O lines GIO2<1:N>. The internal data ID<1:K> may be transmitted through the second I/O lines GIO2<1:N>.

The error corrector 600 may generate correction parity bits EC_P<1:M> including the error information on the internal data ID<1:K> in synchronization with the first delayed strobe signal STRD1 during the write operation and may generate correction data EC_ID<1:K> by correcting erroneous bits of the internal data ID<1:K> with the error information during the read operation. The error corrector 600 may generate a parity strobe signal PSTR by delaying the first delayed strobe signal STRD1 during the write operation and may generate a correction strobe signal EC_STR by delaying a second strobe signal STR2 during the read operation.

During the read operation, the error information may correspond to parity bits P<1:M> which are outputted from the memory portion after the correction parity bits EC_P<1:M> are transmitted as the parity bits P<1:M> and are stored in the memory portion during the write operation. The error corrector 600 may be realized using an error correction code (ECC) circuit. The number 'M' of bits of the parity bits P<1:M> including the error information may be determined by the number 'K' of bits of the internal data ID<1:K> and may be set to be different according to the embodiments.

The number 'M' of bits of the parity bits P<1:M> including the error information may be set as described with reference to FIG. 4. Thus, a description of the number 'M' of bits of the parity bits P<1:M> will be omitted hereinafter to avoid duplicate explanation.

The second repeater 700 may output the correction parity bits EC_P<1:M> as the parity bits P<1:M> in synchronization with the parity strobe signal PSTR and may generate a parity delay strobe signal PSTRD by delaying the parity strobe signal PSTR in synchronization with the parity strobe signal PSTR, during the write operation. The second repeater 700 may output the correction parity bits EC_P<1:M> as the parity bits P<1:M>, and the parity bits P<1:M> may be transmitted through the second I/O lines GIO2<1:N>. The parity delay strobe signal PSTRD may be transmitted through any one of the second I/O lines GIO2<1:N>.

The third repeater 800 may generate a second delayed strobe signal STRD2 by delaying the correction strobe signal EC_STR and may output the correction data EC_ID<1:K> as the data D<1:K>, during the read operation. The third repeater 800 may output the correction strobe signal EC_STR as the second delayed strobe signal STRD2, and the second delayed strobe signal STRD2 may be loaded on any one of the first I/O lines GIO1<1:N>. During the read operation, the third repeater 800 may output the correction data EC_ID<1:K> as the data D<1:K> and the data D<1:K> may be loaded on the first I/O lines GIO1<1:N>.

The second I/O circuit 43 of the semiconductor system illustrated in FIG. 8 may be realized to have substantially the same configuration as the first I/O circuit 42 described with reference FIG. 9 except input and output signals thereof. Thus, a description of the second I/O circuit 43 will be omitted hereinafter.

Figure 10:
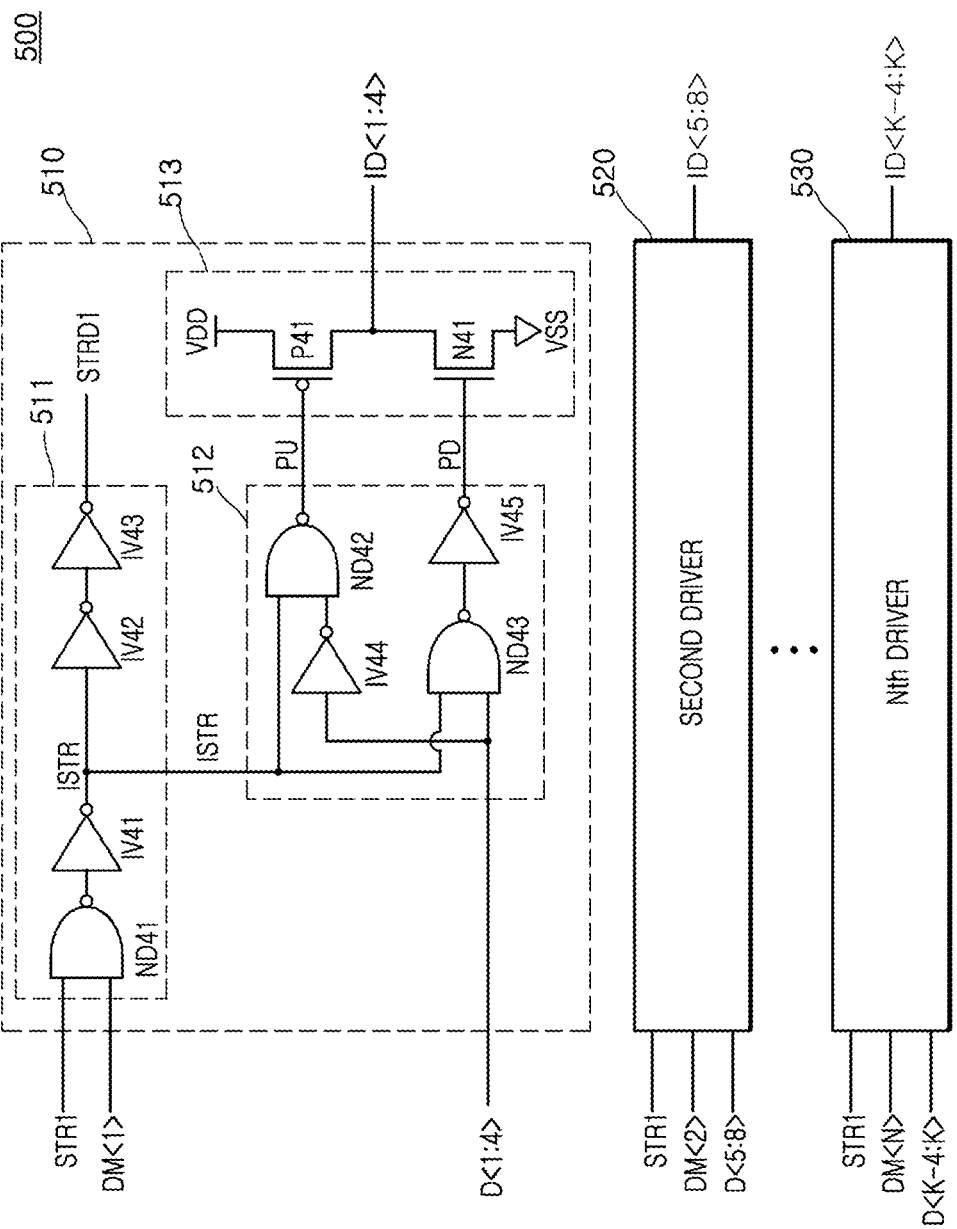
FIG. 10 is a circuit diagram illustrating a first repeater included in the first I/O circuit of FIG. 9.

Referring to FIG. 10, the first repeater 500 may include a first driver 510 to an $N^{th}$ driver 530.

The first driver 510 may include a buffer 511, a pull-up/pull-down signal generator 512 and a driver 513.

The buffer 511 may be realized to include a NAND gate ND41 and inverters IV41, IV42 and IV43 and may delay the first strobe signal STR1 according to a level of the first masking signal DM<1> to generate an internal strobe signal ISTR and the first delayed strobe signal STRD1.

The pull-up/pull-down signal generator 512 may be realized to include NAND gates ND42 and ND43 and inverters IV44 and IV45 and may generate a pull-up signal PU and a pull-down signal PD according to levels of the first to fourth data D<1:4> in synchronization with the internal strobe signal ISTR.

The driver 513 may be realized to include a PMOS transistor P41 and an NMOS transistor N41 and may drive the first to fourth internal data ID<1:4> in response to the pull-up signal PU and the pull-down signal PD.

The first driver 510 may block the input of the first to fourth data D<1:4> according to a level of the first masking signal DM<1> or may generate the first to fourth internal data ID<1:4> from the first to fourth data D<1:4>. Although FIG. 10 illustrates an example in which the number of bits of the data D<1:4> blocked by the first masking signal DM<1> is four, the present disclosure is not limited thereto. The number of bits of the data D<1:4> blocked by the first masking signal DM<1> may be set to be different according to the embodiments.

The second driver 520 may block the input of the fifth to eighth data D<5:8> according to a level of the second masking signal DM<2> or may generate the fifth to eighth internal data ID<5:8> from the fifth to eighth data D<5:8>. Although FIG. 10 illustrates an example in which the number of bits of the data D<5:8> blocked by the second masking signal DM<2> is four, the present disclosure is not limited thereto. The number of bits of the data D<5:8> blocked by the second masking signal DM<2> may be set to be different according to the embodiments.

The $N^{th}$ driver 530 may block the input of the $(K-4)^{th}$ to the $K^{th}$ data D<(K-4):K> according to a level of the $N^{th}$ masking signal DM<N> or may generate the $(K-4)^{th}$ to the $K^{th}$ internal data ID<(K-4):K> from the $(K-4)^{th}$ to the $K^{th}$ data D<(K-4):K>. Although FIG. 10 illustrates an example in which the number of bits of the data D<(K-4):K> blocked by the $N^{th}$ masking signal DM<N> is four, the present disclosure is not limited thereto. The number of bits of the data D<(K-4):K> blocked by the $N^{th}$ masking signal DM<N> may be set to be different according to the embodiments.

Each of the second to $N^{th}$ drivers 520 to 530 may be realized to have substantially the same configuration as the first driver 510 except I/O signals thereof. Thus, a description of each of the second to $N^{th}$ drivers 520 to 530 will be omitted hereinafter.

Figure 11:
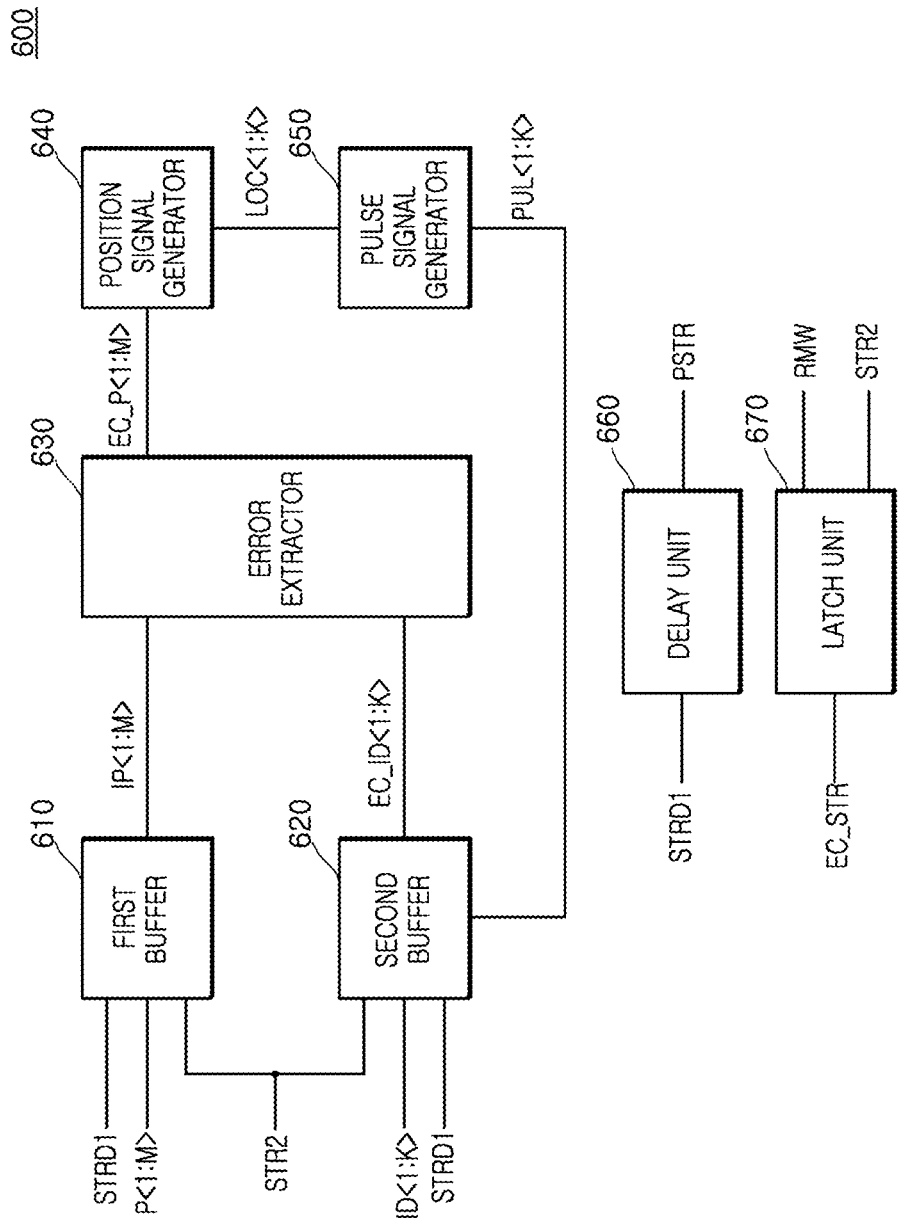
FIG. 11 is a block diagram illustrating an error corrector included in the first I/O circuit of FIG. 9.

Referring to FIG. 11, the error corrector 600 may include a first buffer 610, a second buffer 620, an error extractor 630, a position signal generator 640, a pulse signal generator 650, a delay unit 660 and a latch unit 670.

The first buffer 610 may output the parity bits P<1:M> as internal parity bits IP<1:M> in response to the first delayed strobe signal STRD1 and the second strobe signal STR2.

The second buffer 620 may output the internal data ID<1:K> as the correction data EC_ID<1:K> in response to the first delayed strobe signal STRD1 and the second strobe signal STR2. In such an example, the second buffer 620 may reverse levels of erroneous bits of the internal data ID<1:K> to correct the internal data ID<1:K> and may output the corrected signals of the internal data ID<1:K> as the correction data EC_ID<1:K>, in response to a pulse signal PUL<1:K>.

The error extractor 630 may extract error information from the correction data EC_ID<1:K> to generate the correction parity bits EC_P<1:M> during the write operation and may output the internal parity bits IP<1:M> as the correction parity bits EC_P<1:M> during the read operation.

The position signal generator 640 may decode the correction parity bits EC_P<1:M> to generate a position signal LOC<1:K>. The position signal LOC<1:K> may include position information on erroneous bits of the correction data EC_ID<1:K>.

The pulse signal generator 650 may generate the pulse signal PUL<1:K> including a pulse that occurs in response to the position signal LOC<1:K>.

The delay unit 660 may delay the first delayed strobe signal STRD1 to generate the parity strobe signal PSTR.

The latch unit 670 may latch the second strobe signal STR2 and may output the latched signal of the second strobe signal STR2 as the correction strobe signal EC_STR in response to the external command RMW.

Figure 12:
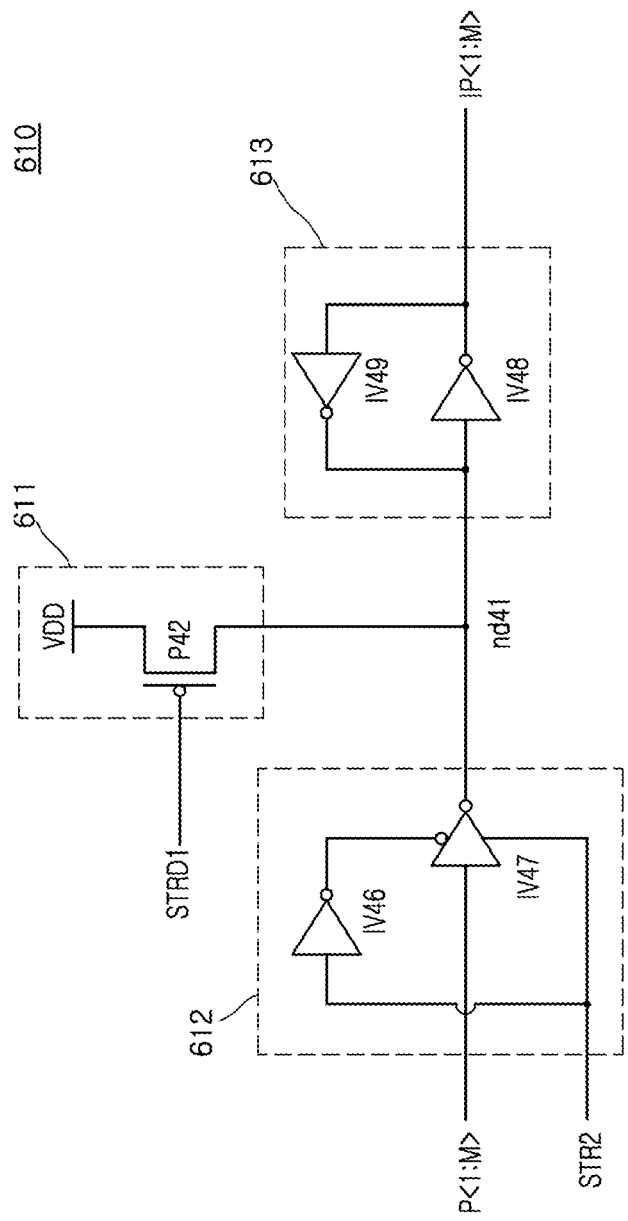
FIG. 12 is a circuit diagram illustrating a first buffer included in the error corrector of FIG. 11.

Referring to FIG. 12, the first buffer 610 may include an initializer 611, a first transmitter 612 and a second transmitter 613.

The initializer 611 may be realized using a PMOS transistor P42 coupled between a power supply voltage VDD terminal and a node ND41 and may drive the node ND41 to a level of the power supply voltage VDD in response to the first delayed strobe signal STRD1.

The first transmitter 612 may be realized to include inverters IV46 and IV47. The first transmitter 612 may inversely buffer the parity bits P<1:M> to output the inversely buffered signals of the parity bits P<1:M> to the node ND41, in response to the second strobe signal STR2. The inverter IV47 may be realized using a three-phase inverter which is turned on in response to the second strobe signal STR2.

The second transmitter 613 may be realized to include inverters IV48 and IV49. The second transmitter 613 may latch a signal of the node ND41 and may inversely buffer the latched signal of the node ND41 to generate the internal parity bits IP<1:M>.

The first buffer 610 may output the parity bits P<1:M> as the internal parity bits IP<1:M> in response to the first delayed strobe signal STRD1 and the second strobe signal STR2.

Figure 13:
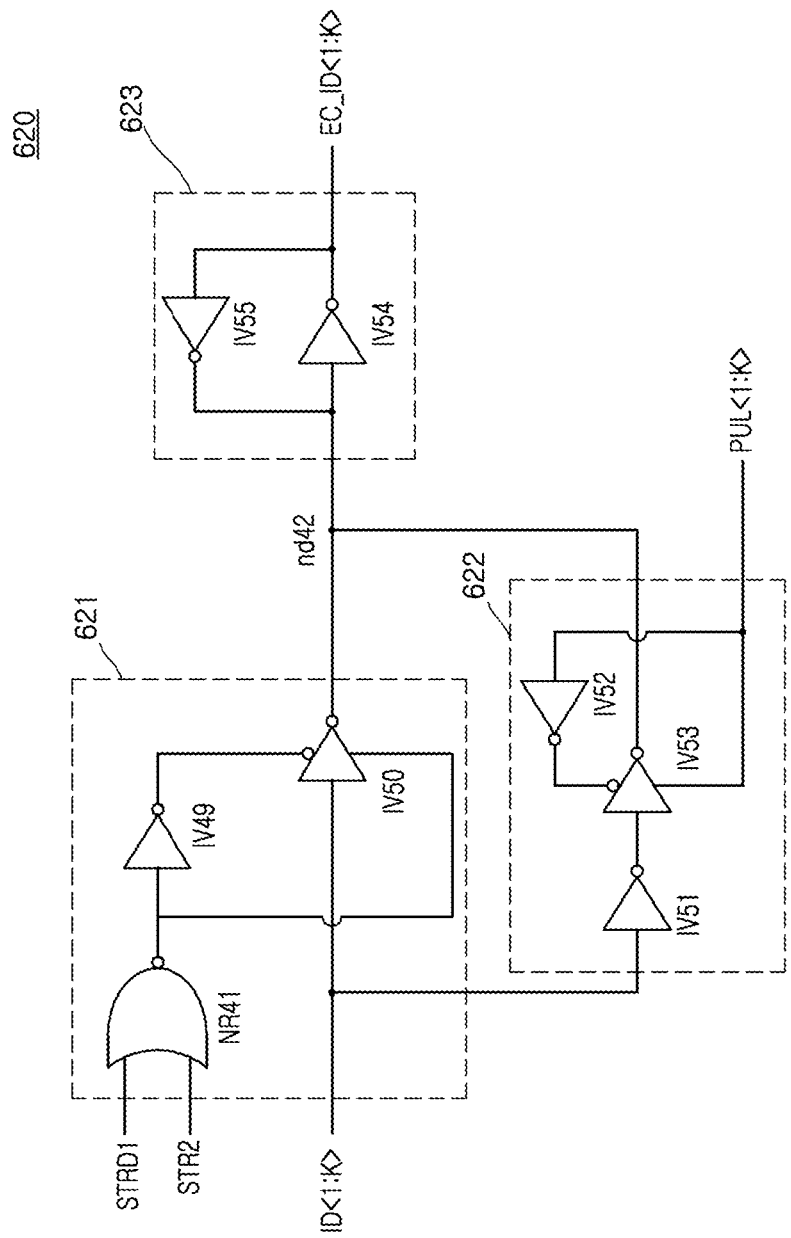
FIG. 13 is a circuit diagram illustrating a second buffer included in the error corrector of FIG. 11.

Referring to FIG. 13, the second buffer 620 may include a third transmitter 621, a fourth transmitter 622 and a fifth transmitter 623.

The third transmitter 621 may be realized to include a NOR gate NR41 and inverters IV49 and IV50. The third transmitter 621 may inversely buffer the internal data ID<1:K> to output the inversely buffered signals of the internal data ID<1:K> to a node ND42 if the first delayed strobe signal STRD1 or the second strobe signal STR2 is inputted thereto. The inverter IV50 may be realized using a three-phase inverter which is turned on in response to an output signal of the NOR gate NR41.

The fourth transmitter 622 may be realized to include inverters IV51, IV52 and IV53. The fourth transmitter 622 may buffer the internal data ID<1:K> to output the buffered signals of the internal data ID<1:K> to the node ND42 if a pulse of the pulse signal PUL<1:K> is inputted thereto. The inverter IV53 may be realized using a three-phase inverter which is turned on in response to the pulse signal PUL<1:K>.

The fifth transmitter 623 may be realized to include inverters IV54 and IV55. The fifth transmitter 623 may latch a signal of the node ND42 and may inversely buffer the latched signal of the node ND42 to generate the correction data EC_ID<1:K>.

The second buffer 620 may output the internal data ID<1:K> as the correction data EC_ID<1:K> in response to the first delayed strobe signal STRD1 and the second strobe signal STR2. In an example, the second buffer 620 may reverse levels of erroneous bits of the internal data ID<1:K> to correct the internal data ID<1:K> in response to the pulse signal PUL<1:K>.

An operation of the semiconductor system having the aforementioned configuration will be described hereinafter with reference to FIGS. 8 to 13 in conjunction with an example in which the write operation and the read operation are applied to the first memory portion 50 to correct erroneous bits of the external data ED<1:K>.

First, if the write operation of the semiconductor system is executed, the first semiconductor device 3 may output the external command RMW, the external strobe signal ESTR and the external data ED<1:K>.

The aligner 41 may output the external strobe signal ESTR as the first strobe signal STR1 through the first I/O lines GIO1<1:N> and may output the external data ED<1:K> as the data D<1:K> through the first I/O lines GIO1<1:N>.

The first repeater 500 of the first I/O circuit 42 may block the input of at least one of the data D<1:K> according to the masking signal DM<1:N>. The first repeater 500 may also generate the internal data ID<1:K> from the data D<1:K> and may output the internal data ID<1:K> through the second I/O lines GIO2<1:N>, in synchronization with the first strobe signal STR1. The first repeater 500 may delay the first strobe signal STR1 to generate the first delayed strobe signal STRD1 and the first delayed strobe signal STRD1 may be outputted through the second I/O lines GIO2<1:N>.

The error corrector 600 may generate the correction parity bits EC_P<1:M> including error information on the internal data ID<1:K> in synchronization with the first delayed strobe signal STRD1 and may delay the first delayed strobe signal STRD1 to generate the parity strobe signal PSTR in synchronization with the first delayed strobe signal STRD1.

The second repeater 700 may output the correction parity bits EC_P<1:M> as the parity bits P<1:M> through the second I/O lines GIO2<1:N> in synchronization with the parity strobe signal PSTR. The second repeater 700 may delay the parity strobe signal PSTR to generate the parity delay strobe signal PSTRD, and the parity delay strobe signal PSTRD may be outputted through the second I/O lines GIO2<1:N>.

The first memory portion 50 may store the parity bits P<1:M> and the internal data ID<1:K> loaded on the second I/O lines GIO2<1:N>.

Next, if the read operation of the semiconductor system is executed, the first memory portion 50 may output the parity bits P<1:M> and the internal data ID<1:K> through the second I/O lines GIO2<1:N>.

The error corrector 600 may correct erroneous bits of the internal data ID<1:K> with the parity bits P<1:M> to generate the correction data EC_ID<1:K> and may delay the second strobe signal STR2 to generate the correction strobe signal EC_STR in response to the external command RMW.

The third repeater 800 may delay the correction strobe signal EC_STR to generate the second delayed strobe signal STRD2 and may output the correction data EC_ID<1:K> as the data D<1:K> through the first I/O lines GIO1<1:N>.

The aligner 41 may output the second delayed strobe signal STRD2 as the external strobe signal ESTR and may align the data D<1:K> loaded on the first I/O lines GIO1<1:N> to output the aligned data of the data D<1:K> as the external data ED<1:K>, in synchronization with the second delayed strobe signal STRD2.

The first semiconductor device 3 may receive the external data ED<1:K> having corrected bits in synchronization with the external strobe signal ESTR.

The semiconductor system according to an embodiment may extract error information on data which are masked during a read modification write (RMW) operation that a write operation and a read operation are successively executed. In addition, an ECC circuit may be disposed to be adjacent to a repeater that drives I/O lines through which signals of a semiconductor device of the semiconductor system are transmitted. Thus, the number of the I/O lines on which the error information is loaded may be reduced to increase the integration density of the semiconductor device.

Figure 14:
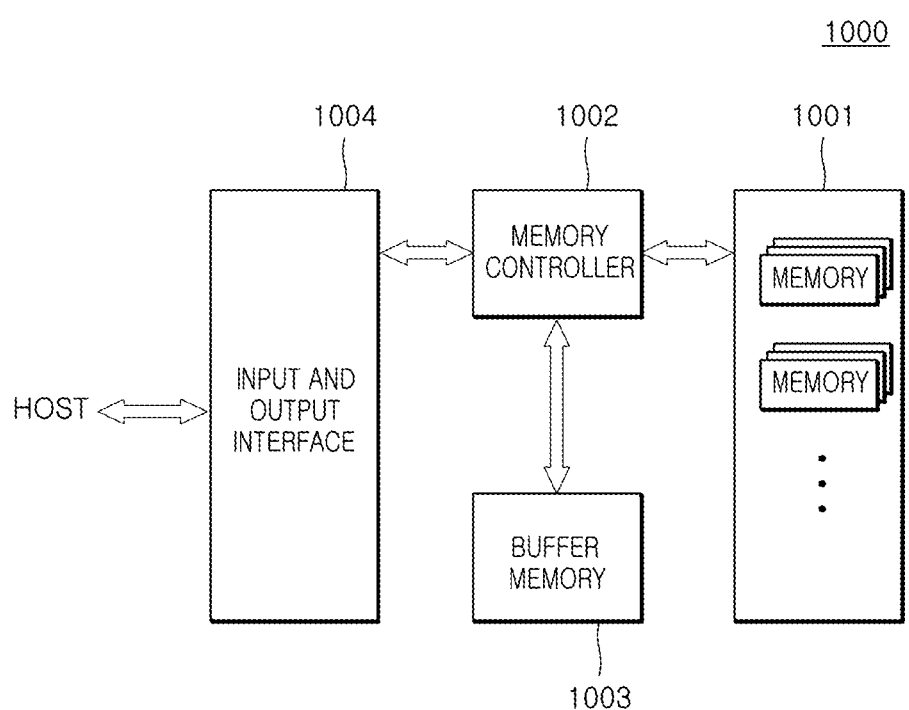
FIG. 14 is a block diagram illustrating an electronic system including any one of the semiconductor systems illustrated in FIGS. 1 to 13.

At least one of the I/O circuits, semiconductor devices or at least one of the semiconductor systems described with reference to FIGS. 1 to 13 may be applied to an electronic system that may include a memory system, a graphic system, a computing system, a mobile system, or the like. For example, an electronic system 1000 according an embodiment may include a data storage unit 1001, a memory controller 1002, a buffer memory 1003, and an I/O interface 1004, as illustrated in FIG. 14.

The data storage unit 1001 may store data which are outputted from the memory controller 1002 or may read and output the stored data to the memory controller 1002, according to a control signal generated from the memory controller 1002. The data storage unit 1001 may include the second semiconductor device 2 illustrated in FIG. 1 or the second semiconductor device 4 illustrated in FIG. 8. The data storage unit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage unit 1001 or the buffer memory 1003 or for outputting the data stored in the data storage unit 1001 or the buffer memory 1003. The memory controller 1002 may include the first semiconductor device 1 illustrated in FIG. 1 or the first semiconductor device 3 illustrated in FIG. 8. Although FIG. 14 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage unit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
    a first semiconductor device configured for outputting an external command, an external strobe signal and external data; and
    a second semiconductor device configured for blocking transmission of at least one bit included in the external data in response to the external command during a write operation, configured for extracting error information from the external data in synchronization with the external strobe signal during the write operation, configured for outputting the external data and the error information through input/output (I/O) lines during the write operation, and configured for correcting errors of internal data with the error information loaded on the I/O lines to output the corrected internal data as the external data during a read operation.

2. The semiconductor system of claim 1, wherein the external command is inputted to the second semiconductor device for an operation that the write operation is executed without outputting the external data after the read operation or for an operation that blocks transmission of at least one bit included in the external data.

3. The semiconductor system of claim 1, wherein the error information includes position information on bits of the external data that are inputted into the second semiconductor device without blocking.

4. The semiconductor system of claim 1,
    wherein the I/O lines include first I/O lines, second I/O lines and third I/O lines; and
    wherein the second semiconductor device includes:
    a peripheral portion configured for outputting the external strobe signal and the external data through the first I/O lines in response to the external command, configured for extracting the error information on the external data in synchronization with the external strobe signal loaded on the first I/O lines, and configured for outputting the error information through the second and third I/O lines;
    a first memory portion configured for storing the error information loaded on the second I/O lines and the internal data generated from the external data during the write operation and configured for outputting the error information and the internal data through the second I/O lines during the read operation; and
    a second memory portion configured for storing the error information loaded on the third I/O lines and the internal data generated from the external data during the write operation and configured for outputting the error information and the internal data through the third I/O lines during the read operation.

5. The semiconductor system of claim 4, wherein the peripheral portion is configured for correcting errors of the internal data with the error information loaded on the second I/O lines and configured for correcting the errors of the internal data with the error information loaded on the third I/O lines, during the read operation.

6. The semiconductor system of claim 4, wherein the peripheral portion reverses levels of erroneous bits included in the internal data with the error information.

7. The semiconductor system of claim 4, wherein the peripheral portion includes:
    an aligner configured for outputting the external strobe signal and the external data through the first I/O lines in response to the external command during the write operation and configured for aligning data on the first I/O lines in synchronization with a first strobe signal to generate the external strobe signal and the external data during the read operation;
    a first I/O circuit configured for extracting the error information from the data in synchronization with the first strobe signal loaded on the first I/O lines to output the extracted error information through the second I/O lines and configured for correcting errors of the internal data with the error information loaded on the second I/O lines; and
    a second I/O circuit configured for extracting the error information from the data in synchronization with the first strobe signal loaded on the first I/O lines to output the extracted error information through the third I/O lines and configured for correcting errors of the internal data with the error information loaded on the third I/O lines.

8. The semiconductor system of claim 7, wherein the first I/O circuit includes:
    a first repeater configured for blocking input of at least one of the data according to a masking signal, configured for generating the internal data from the data in synchronization with the first strobe signal, and configured for delaying the first strobe signal to generate a first internal strobe signal and a first delayed strobe signal;
    a first error corrector configured for generating first correction parity bits including error information on the internal data in synchronization with the first delayed strobe signal, configured for generating first correction data by correcting erroneous bits of the internal data with the error information in synchronization with the first internal strobe signal, and configured for generating a first correction strobe signal and a first parity strobe signal by delaying the first delayed strobe signal in response to the external command;

a second repeater configured for outputting the first correction parity bits as first parity bits in synchronization with the first parity strobe signal and configured for generating a first parity delay strobe signal by delaying the first parity strobe signal; and a third repeater configured for generating a second delayed strobe signal by delaying the first correction strobe signal and configured for outputting the first correction data as the data.

9. The semiconductor system of claim 8, wherein the first error corrector is coupled between the first, second, and third repeaters and is disposed adjacent to the first, second, and third repeaters.

10. The semiconductor system of claim 7, wherein the second I/O circuit includes:
a fourth repeater configured for blocking input of at least one of the data according to a masking signal, configured for generating the internal data from the data in synchronization with the first strobe signal, and configured for delaying the first strobe signal to generate a second internal strobe signal and a third delayed strobe signal;

a second error corrector configured for generating second correction parity bits including error information on the internal data in synchronization with the third delayed strobe signal, configured for generating second correction data by correcting erroneous bits of the internal data with the error information in synchronization with the second internal strobe signal, and configured for generating a second correction strobe signal and a second parity strobe signal by delaying the third delayed strobe signal in response to the external command;

a fifth repeater configured for outputting the second correction parity bits as second parity bits in synchronization with the second parity strobe signal and configured for generating a second parity delay strobe signal by delaying the second parity strobe signal; and a sixth repeater configured for generating a fourth delayed strobe signal by delaying the second correction strobe signal and configured for outputting the second correction data as the data.

11. A data input/output (I/O) circuit comprising:
a first repeater configured for receiving a first strobe signal and data through first I/O lines to generate internal data from the data in synchronization with the first strobe signal during a write operation, configured for outputting the internal data through second I/O lines during the write operation, and configured for delaying the first strobe signal to output the delayed first strobe signal as a first delayed strobe signal through the second I/O lines during the write operation;

an error corrector configured for generating correction parity bits including error information on the internal data in synchronization with the first delayed strobe signal during the write operation, configured for generating correction data by correcting erroneous bits of the internal data with the error information during a read operation, and configured for generating a parity strobe signal by delaying the first delayed strobe signal;

a second repeater configured for outputting the correction parity bits as parity bits through the second I/O lines in synchronization with the parity strobe signal and configured for generating a parity delay strobe signal by delaying the parity strobe signal; and a third repeater configured for generating a second delayed strobe signal by delaying a correction strobe signal and configured for outputting the correction data as the data through the first I/O lines.

12. The data I/O circuit of claim 11, wherein the error information includes position information on erroneous bits included in the data.

13. The data I/O circuit of claim 11, the error corrector includes:
a first buffer configured for outputting the parity bits as internal parity bits in response to the first delayed strobe signal and a second strobe signal;

a second buffer configured for outputting the internal data as the correction data in response to the first delayed strobe signal and the second strobe signal, wherein the second buffer reverses levels of erroneous bits of the internal data to correct the internal data in response to a pulse signal and outputs the corrected internal data as the correction data;

an error extractor configured for extracting error information from the correction data to generate the correction parity bits or configured for outputting the internal parity bits as the correction parity bits;

a position signal generator configured for decoding the correction parity bits to generate a position signal; and a pulse signal generator configured for generating the pulse signal including a pulse that occurs in response to the position signal.

14. The data I/O circuit of claim 13, wherein the pulse signal is enabled at a point of time that an erroneous bit of the internal data is inputted.

15. The data I/O circuit of claim 13, wherein the first buffer includes:
an initializer configured for initializing a first node to a level of a power supply voltage in response to the first delayed strobe signal;

a first transmitter configured for inversely buffering the parity bits to output the inversely buffered signal of the parity bits to the first node in response to the second strobe signal; and a second transmitter configured for latching a signal of the first node and configured for inversely buffering the latched signal to generate the internal parity bits.

16. The data I/O circuit of claim 13, wherein the second buffer includes:
a third transmitter configured for inversely buffering the internal data to output the inversely buffered internal data to a second node if the first delayed strobe signal or the second strobe signal is inputted to the third transmitter;

a fourth transmitter configured for buffering the internal data in response to the pulse signal to output the buffered internal data to the second node; and a fifth transmitter configured for latching a signal of the second node and configured for inversely buffering the latched signal to generate the correction data.

17. A semiconductor device comprising:
a first memory portion including at least one bank;
a second memory portion including at least one bank; and a peripheral portion coupled between the first memory portion and the second memory portion through input/output (I/O) lines, and configured to receive an external strobe signal and external data, wherein the peripheral portion is configured for extracting error information from the external data in synchronization with the external strobe signal during a write operation, configured for outputting the external data and the error information through the I/O lines during the write operation, and configured for correcting errors of internal data with the error information loaded on the I/O lines to output the corrected internal data as the external data during a read operation.

18. The semiconductor system of claim 17, wherein the error information includes position information on erroneous bits included in the external data.

19. The semiconductor system of claim 17,
wherein the I/O lines include first I/O lines, second I/O lines and third I/O lines,
wherein the peripheral portion is configured for outputting the external strobe signal and the external data through the first I/O lines, configured for extracting the error information on the external data in synchronization with the external strobe signal loaded on the first I/O lines, and configured for outputting the error information through the second and third I/O lines,
wherein the first memory portion configured for storing the error information loaded on the second I/O lines and the internal data generated from the external data during the write operation and configured for outputting the error information and the internal data through the second I/O lines during the read operation; and
wherein the second memory portion configured for storing the error information loaded on the third I/O lines and the internal data generated from the external data during the write operation and configured for outputting the error information and the internal data through the third I/O lines during the read operation.

20. A semiconductor device comprising:
a first memory portion including at least one bank;
a second memory portion including at least one bank; and
a peripheral portion coupled between the first memory portion and the second memory portion through input/output (I/O) lines, and configured to receive an external command, external strobe signal, and external data,
wherein the peripheral portion is configured for blocking transmission of at least one bit included in the external data in response to the external command during a write operation, configured for extracting error information from the external data in synchronization with the external strobe signal during the write operation, configured for outputting the external data and the error information through the I/O lines during the write operation, and configured for correcting errors of internal data with the error information loaded on the I/O lines to output the corrected internal data as the external data during a read operation.

21. The semiconductor device of claim 20, wherein the external command is received by the peripheral portion for an operation that the write operation is executed without outputting the external data after the read operation or for an operation that blocks transmission of at least one bit included in the external data.

22. The semiconductor system of claim 20, wherein the error information includes position information on bits of the external data that are inputted into the peripheral portion without blocking.

23. The semiconductor system of claim 20,
wherein the I/O lines include first I/O lines, second I/O lines and third I/O lines,
wherein the peripheral portion is configured for outputting the external strobe signal and the external data through the first I/O lines in response to the external command, configured for extracting the error information on the external data in synchronization with the external strobe signal loaded on the first I/O lines, and configured for outputting the error information through the second and third I/O lines,
wherein the first memory portion is configured for storing the error information loaded on the second I/O lines and the internal data generated from the external data during the write operation and configured for outputting the error information and the internal data through the second I/O lines during the read operation, and
wherein the second memory portion is configured for storing the error information loaded on the third I/O lines and the internal data generated from the external data during the write operation and configured for outputting the error information and the internal data through the third I/O lines during the read operation.

24. The semiconductor system of claim 23, wherein the second error corrector is coupled between the fourth, fifth, and sixth repeaters and is disposed adjacent to the fourth, fifth, and sixth repeaters.

* * * * *